US012564880B2

(12) United States Patent
Matsubara

(10) Patent No.: US 12,564,880 B2
(45) Date of Patent: Mar. 3, 2026

(54) METHOD FOR PRODUCING SPUTTERING TARGET MATERIAL

(71) Applicant: Sanyo Special Steel Co., Ltd., Himeji (JP)

(72) Inventor: Noriaki Matsubara, Himeji (JP)

(73) Assignee: Sanyo Special Steel Co., Ltd., Himeji (JP)

( * ) Notice: Subject to any disclaimer, the term of this patent is extended or adjusted under 35 U.S.C. 154(b) by 876 days.

(21) Appl. No.: 17/790,803

(22) PCT Filed: Jan. 6, 2021

(86) PCT No.: PCT/JP2021/000186
§ 371 (c)(1),
(2) Date: Jul. 5, 2022

(87) PCT Pub. No.: WO2021/141042
PCT Pub. Date: Jul. 15, 2021

(65) Prior Publication Data
US 2023/0048285 A1     Feb. 16, 2023

(30) Foreign Application Priority Data
Jan. 6, 2020    (JP) ................................ 2020-000248

(51) Int. Cl.
| | |
|---|---|
| *B22F 1/00* | (2022.01) |
| *C22C 1/04* | (2023.01) |
| *C22C 19/07* | (2006.01) |
| *C22C 30/00* | (2006.01) |
| *C22C 38/00* | (2006.01) |
| *C22C 38/10* | (2006.01) |
| *C23C 14/14* | (2006.01) |
| *C23C 14/34* | (2006.01) |
| *B22F 3/10* | (2006.01) |

(52) U.S. Cl.
CPC .................. *B22F 1/09* (2022.01); *B22F 1/00* (2013.01); *C22C 1/0433* (2013.01); *C22C 19/07* (2013.01); *C22C 30/00* (2013.01); *C22C 38/002* (2013.01); *C22C 38/10* (2013.01); *C23C 14/14* (2013.01); *C23C 14/3414* (2013.01); *B22F 3/10* (2013.01)

(58) Field of Classification Search
CPC ........................................................ B22F 1/09
See application file for complete search history.

(56) References Cited

U.S. PATENT DOCUMENTS

| | | | | |
|---|---|---|---|---|
| 7,141,208 | B2 * | 11/2006 | Ueno | .................. C22C 32/0073 |
| | | | | 419/49 |
| 7,780,826 | B2 | 8/2010 | Sawada et al. | |
| 10,199,203 | B2 | 2/2019 | Yang et al. | |
| 10,377,726 | B2 | 8/2019 | Zheng et al. | |
| 10,644,230 | B2 | 5/2020 | Arakawa | |
| 10,724,134 | B2 | 7/2020 | Arakawa | |
| 10,844,476 | B2 | 11/2020 | Hasegawa et al. | |
| 2018/0245211 | A1 * | 8/2018 | Hasegawa | ............. C22C 38/002 |
| 2022/0145433 | A1 | 5/2022 | Hasegawa | |

FOREIGN PATENT DOCUMENTS

| | | | |
|---|---|---|---|
| JP | 2004346423 | A | 12/2004 |
| JP | 200845173 | A | 2/2008 |
| JP | 201757477 | A | 3/2017 |
| JP | 201757490 | A | 3/2017 |
| JP | 2018526525 | A | 9/2018 |
| WO | 2015080009 | A1 | 6/2015 |
| WO | 2016140113 | A1 | 9/2016 |
| WO | 2020175424 | A1 | 9/2020 |

\* cited by examiner

*Primary Examiner* — Alexandra M Moore
(74) *Attorney, Agent, or Firm* — The Webb Law Firm

(57) ABSTRACT

Provided is a method of producing a target material with reduced particle generation during sputtering, which is a method of producing a sputtering target material whose material is an alloy M, including a sintering step of sintering a mixed powder obtained by mixing a first powder and a second powder. A material of the first powder is an alloy M1 in which the proportion of a B content is from 40 at. % to 60 at. %. A material of the second powder is an alloy M2 in which the proportion of a B content is from 20 at. % to 35 at. %. The proportion of a B content in the mixed powder is from 33 at. % to 50 at. %. A metallographic structure including a $(CoFe)_2B$ phase and a $(CoFe)B$ phase is formed in the sintering step. A boundary length per unit area Y $(1/\mu m)$, which is obtained by measuring a boundary length between the $(CoFe)_2B$ phase and the $(CoFe)B$ phase using a scanning electron microscope, and a proportion X (at. %) of a B content of the alloy M satisfy the expression $$Y < -0.0015 \times (X-42.5)^2 + 0.15.$$

1 Claim, 2 Drawing Sheets

METHOD FOR PRODUCING SPUTTERING TARGET MATERIAL

CROSS-REFERENCE TO RELATED APPLICATIONS

This application is the United States national phase of International Application No. PCT/JP2021/000186 filed Jan. 6, 2021, and claims priority to Japanese Patent Application No. 2020-000248 filed Jan. 6, 2020, the disclosures of which are hereby incorporated by reference in their entirety.

BACKGROUND OF THE INVENTION

Field of the Invention

The present invention relates to a method of producing a sputtering target material. More specifically, the present invention relates to a method of producing a sputtering target material that can be suitably used for producing a magnetic layer.

Description of Related Art

Magnetic tunnel junction (MTJ) elements are used in magnetic devices such as magnetic heads and magnetic random access memories (MRAMs). MTJ elements exhibit features such as high tunnel magnetoresistive (TMR) signals and low switching current densities (Jc).

The magnetic tunnel junction (MTJ) element usually has a structure in which two magnetic layers consisting of a Co—Fe—B alloy sandwich a shielding layer consisting of MgO. This magnetic layer is a thin film obtained by sputtering using a target material composed of a Co—Fe—B alloy. By increasing the boron (B) content proportion in the target Co—Fe—B alloy, the magnetic performance of the obtained magnetic layer is improved and high TMR signals of the MTJ element are achieved.

Meanwhile, as the boron content proportion increases, the frequency of particle generation during sputtering increases. In particular, particles are noticeably generated when a target material consisting of an alloy having a boron content proportion of 33 at. % or more is used. Particle generation causes quality deterioration of the obtained magnetic film. Magnetic films having deteriorated quality destabilize the performance of magnetic devices. Therefore, there is a problem that the yield is lowered.

Japanese Unexamined Patent Publication No. 2004-346423 (Patent Literature 1) discloses a Co—Fe—B alloy target material in which the boride phase is finely dispersed in the cross-sectional microstructure. International Publication WO2015-080009 (Patent Literature 2) proposes a magnetic material sputtering target that contains a high boron (B) concentration phase and a low boron (B) concentration phase, in which the high boron (B) concentration phase is finely dispersed. Japanese Unexamined Patent Publication No. 2017-057477 (Patent Literature 3) proposes a sputtering target material with reduced formation of $(CoFe)_3B$, $CO_3B$, and $Fe_3B$. International Publication WO2016-140113 (Patent Literature 4) discloses a magnetic material sputtering target having an oxygen content of 100 ppm by mass or less.

CITATION LIST

Patent Literature

[Patent Literature 1] Japanese Unexamined Patent Publication No. 2004-346423

[Patent Literature 2] International Publication WO2015-080009

[Patent Literature 3] Japanese Unexamined Patent Publication No. 2017-057477

[Patent Literature 4] International Publication WO2016-140113

SUMMARY OF THE INVENTION

Technical Problem

In recent years, in order to improve the performance of MTJ elements, there has been a demand for further increase in a boron content proportion in a Co—Fe—B alloy. Patent Literature 1 does not disclose a target material having a boron content proportion of more than 30 at. %. In Patent Literature 2, an atomized powder consisting of a Co—Fe—B alloy is sieved so as to have a predetermined particle size. In Patent Literature 3, a fine powder is removed from a Co—Fe—B alloy powder used as a target raw material. In Patent Literature 4, an oxide-rich portion is removed from an ingot of a Co—Fe—B alloy. None of the target materials disclosed in Patent Literature 2 to 4 is preferable in terms of manufacturing efficiency.

An object of the present invention is to provide a method of efficiently producing a sputtering target material that generates less particles during sputtering. Another object of the present invention is to provide a sputtering target material that is obtained by the production method.

Solution to Problem

According to the findings of the present inventors, constituent phases of a metallographic structure formed in a target material obtained by sintering a Co—Fe—B alloy powder changes with a boron content proportion of 33 at. % as a boundary. Specifically, in a region where a boron content proportion is 33 at. % or more, a $(CoFe)_2B$ phase and a $(CoFe)B$ phase, which are boride phases, are predominantly formed. The term "$(CoFe)_2B$ phase" used herein refers to a phase in which an atomic ratio of a sum of a Co content and an Fe content (Co content+Fe content) to a B content [(Co content+Fe content):B content] is 2:1, and the term "$(CoFe)B$ phase" used herein refers to a phase in which the atomic ratio [(Co content+Fe content):B content] is 1:1.

As exemplified in Patent Literature 1 and 2, in general, it has been known that particle generation during sputtering tends to be reduced by making a microstructure of an alloy forming a target material more refined. However, as a result of intensive studies, the present inventors found that a step generated at a boundary between a $(CoFe)_2B$ phase and a $(CoFe)B$ phase due to a difference between a sputtering rate of the $(CoFe)_2B$ phase and a sputtering rate of the $(CoFe)B$ phase is a cause of particle generation. Further, the present inventors found that in order to suppress particle generation, contrary to the conventional technical knowledge of refining a metallographic structure, the $(CoFe)_2B$ phase and the $(CoFe)B$ phase are coarsened to some extent to reduce a boundary area thereof, thereby attaining significant effects. This has led to the completion of the present invention.

In other words, the present invention relates to a method of producing a sputtering target material composed of an alloy M including B, and Co and/or Fe, with a balance consisting of inevitable impurities. The production method includes a sintering step of sintering a mixed powder obtained by mixing a first powder and a second powder. The first powder and the second powder each consist of a large number of particles. Each particle forming the first powder is composed of an alloy M1 including B, and Co and/or Fe, with a balance consisting of inevitable impurities. A proportion of a B content to a total of a Co content, an Fe content, and a B content in the alloy M1 is from 40 at. % to 60 at. %. Each particle forming the second powder is composed of an alloy M2 including B, and Co and/or Fe, with a balance consisting of inevitable impurities. A proportion of a B content to a total of a Co content, an Fe content, and a B content in the alloy M2 is from 20 at. % to 35 at. %. A proportion of a B content to a total of a Co content, an Fe content, and a B content in the mixed powder is from 33 at. % to 50 at. %.

In the sintering step of the production method, a metallographic structure including a $(CoFe)_2B$ phase in which an atomic ratio of a sum of a Co content and an Fe content (Co content+Fe content) to a B content [(Co content+Fe content):B content] is 2:1, and a (CoFe)B phase in which the atomic ratio [(Co content+Fe content):B content] is 1:1 is formed. A boundary length per unit area Y ($1/\mu m$) obtained by measuring a boundary length between the $(CoFe)_2B$ phase and the (CoFe)B phase using a scanning electron microscope and a proportion X (at. %) of a B content to a total of a Co content, an Fe content, and a B content in the alloy M satisfy the following expression:

$$Y < -0.0015 \times (X-42.5)^2 + 0.15.$$

From another viewpoint, the present invention relates to a sputtering target material composed of an alloy M including B, and Co and/or Fe, with a balance consisting of inevitable impurities. A proportion X of a B content to a total of a Co content, an Fe content, and a B content in the alloy M is from 33 at. % to 50 at. %. A metallographic structure of the alloy M includes a $(CoFe)_2B$ phase in which an atomic ratio of a sum of a Co content and an Fe content (Co content+Fe content) to a B content [(Co content+Fe content):B content] is 2:1, and a (CoFe)B phase in which the atomic ratio [(Co content+Fe content):B content] is 1:1. In the sputtering target material, a boundary length per unit area Y ($1/\mu m$), which is obtained by measuring a boundary length between the $(CoFe)_2B$ phase and the (CoFe)B phase using a scanning electron microscope, and a proportion X (at. %) of a B content satisfy the following expression:

$$Y < -0.0015 \times (X-42.5)^2 + 0.15.$$

Advantageous Effects of Invention

In the production method according to the present invention, a metallographic structure in which a boundary length between a $(CoFe)_2B$ phase and a (CoFe)B phase satisfies a predetermined condition is formed in a target material composed of a Co—Fe—B alloy in which a boron content proportion is from 33 at. % to 50 at. %. In the metallographic structure, a boundary area between the $(CoFe)_2B$ phase and the (CoFe)B phase, which is a source of particle generation, is small. According to the production method, a target material with reduced particle generation during sputtering can be efficiently and conveniently produced.

From another viewpoint, the sputtering target material according to the present invention is composed of a Co—Fe—B alloy in which a boron content proportion is from 33 at. % to 50 at. %. A magnetic performance of a magnetic film obtained by using the target material is high. A metallographic structure in which a boundary length between a $(CoFe)_2B$ phase and a (CoFe)B phase satisfies a predetermined condition is formed in the target material. According to the target material, particle generation during sputtering is suppressed, and a yield of magnetic film production is improved. According to the target material, a high-performance and high-quality magnetic film can be efficiently manufactured. The target material is suitable for manufacturing magnetic films used for magnetic devices such as magnetic heads and MRAMs.

DESCRIPTION OF THE INVENTION

Hereinafter, the present invention will be described in detail based on preferred embodiments. The term "X to Y" used herein indicating a range means "X or more and Y or less."

The sputtering target material according to the present invention is composed of an alloy M including B, and Co and/or Fe, with a balance consisting of inevitable impurities. The alloy M may include other metal elements as optional components unless the effects of the present invention are impaired. Examples of inevitable impurities include O, S, C, and N.

A proportion X of a B content to a total of a Co content, an Fe content, and a B content in the alloy M (hereinafter also referred to as "boron(B) content proportion") is from 33 at. % to 50 at. %. By setting the B content proportion X to 33 at. % or more, a magnetic performance of an obtained magnetic film can be improved. By incorporating the magnetic film, high TMR signals of MTJ elements can be achieved. As a pure B phase is formed with an alloy composition in which the B content proportion X exceeds 50 at. %, the metallographic structure described later cannot be obtained. The B content proportion X is preferably from 35 at. % to 48 at. %, more preferably from 35 at. % to 45 at. %, and still more preferably from 38 at. % to 42 at. %.

In the sputtering target material, a metallographic structure including a $(CoFe)_2B$ phase and a (CoFe)B phase is formed. Each of the $(CoFe)_2B$ phase and the (CoFe)B phase is a boride phase which is formed by a reaction of B, and Co and/or Fe. The definitions thereof are as described above.

When observing a metallographic structure formed in the target material using a scanning electron microscope (SEM), a boundary length per unit area Y ($1/\mu m$), which is obtained by measuring a boundary length between the $(CoFe)_2B$ phase and the (CoFe)B phase, is smaller than a value V, which is obtained by substituting the B content proportion X (at. %) in the alloy M into the following mathematical equation:

$$V = -0.0015 \times (X-42.5)^2 + 0.15.$$

In other words, a metallographic structure satisfying the following expression is formed in the sputtering target material:

$$Y < -0.0015 \times (X-42.5)^2 + 0.15.$$

It is preferable that the difference between the value V and the value Y (value V−value Y) is large and that the value Y is small.

The difference between the value V and the value Y (value V−value Y) is preferably from 0.02 to 0.10, more preferably from 0.04 to 0.10, and still more preferably from 0.05 to 0.10.

The value Y is preferably 0.10 or less, more preferably 0.07 or less, and still more preferably 0.06 or less.

Figure 1:
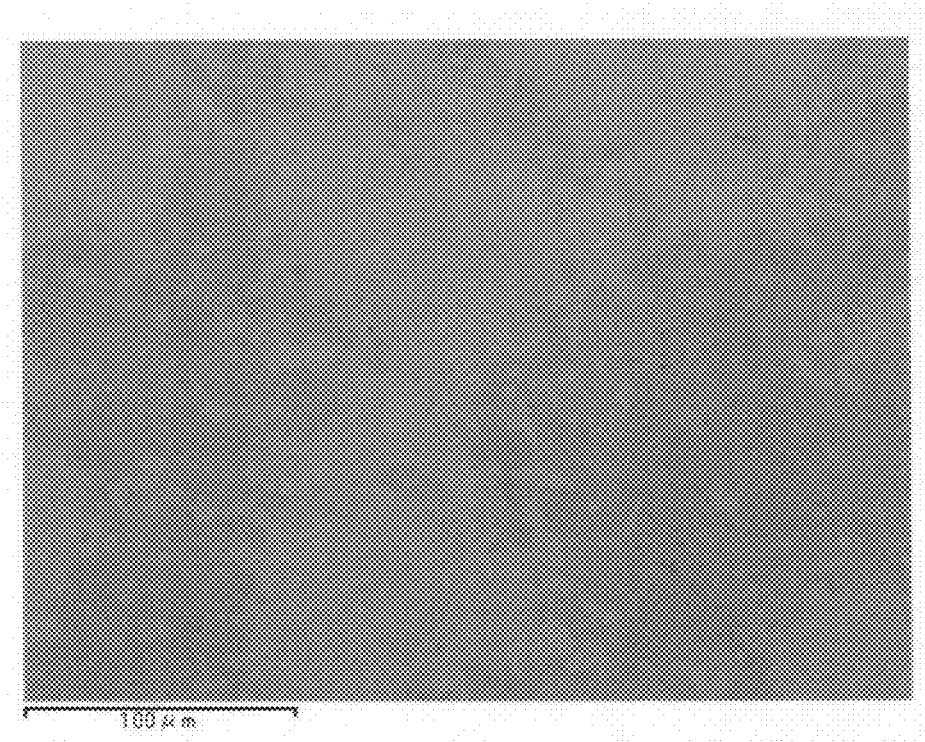
FIG. 1 is a scanning electron microscope image showing the metallographic structure of the alloy forming the sputtering target material of Examples.

FIG. 1 is an SEM image obtained for a target material having a metallographic structure satisfying the above expression. In FIG. 1, the dark gray part is the (CoFe)B phase, and the light gray part is the (CoFe)$_2$B phase. The boundary length per unit area Y (1/μm) is calculated by image-processing a randomly selected region from the SEM image to obtain the boundary length (μm) between the dark gray part and the light gray part and dividing the length by the area of the selected region (μm$^2$). Commercially available image analysis software can be used for image processing.

As shown in FIG. 1, in the metallographic structure satisfying the above expression, the (CoFe)$_2$B phase and the (CoFe)B phase are not finely dispersed, and the boundary area between the (CoFe)$_2$B phase and the (CoFe)B phase is small. Therefore, in sputtering with the target material, a step generated at a boundary between both phases due to a difference between a sputtering rate of the (CoFe)$_2$B phase and a sputtering rate of the (CoFe)B phase is small. According to the target material, particle generation during sputtering is sufficiently suppressed.

As long as the effects of the present invention can be attained, this metallographic structure may have another phase(s), in addition to the (CoFe)$_2$B phase and the (CoFe)B phase. The other phase(s) may be a non-B alloy phase that is essentially boron free. Examples of the non-B alloy phase include a CoFe phase, a Co phase, and an Fe phase.

The sputtering target material is produced by so-called powder metallurgy. In powder metallurgy, a sintered body is formed by heating a powder which is used as a raw material, under high pressure to solidify and mold it. A raw material powder of the sputtering target material according to the present invention is a mixed powder of a first powder and a second powder. In other words, the method of producing a sputtering target material according to the present invention includes a sintering step of sintering a mixed powder obtained by mixing a first powder and a second powder. A target material can be obtained by processing the sintered body into an appropriate shape by mechanical means or the like.

The first powder consists of a large number of particles. Each particle forming the first powder is composed of an alloy M1 including B, and Co and/or Fe, with a balance consisting of inevitable impurities. A proportion of a B content to a total of a Co content, an Fe content, and a B content in the alloy M1 is from 40 at. % to 60 at. %. The B content proportion is preferably from 42 at. % to 58 at. % and more preferably from 45 at. % to 50 at. %.

The second powder consists of a large number of particles. Each particle forming the second powder is composed of an alloy M2 including B, and Co and/or Fe, with a balance consisting of inevitable impurities. A proportion of a B content to a total of a Co content, an Fe content, and a B content in the alloy M2 is from 20 at. % to 35 at. %. The B content proportion is preferably from 24 at. % to 30 at. %.

In a raw material powder which is a mixed powder of the first powder and the second powder, a proportion X of a B content to a total of a Co content, an Fe content, and a B content is from 33 at. % to 50 at. %. In the production method, a mixing ratio of the first powder and the second powder is adjusted such that the B content proportion in the mixed powder satisfies the range of the B content proportion X in the alloy M described above.

By using the mixed powder as a raw material powder, a sputtering target material composed of an alloy M including B, and Co and/or Fe, with a balance consisting of inevitable impurities is obtained. A proportion X of a B content to a total of a Co content, an Fe content, and a B content in the alloy M is from 33 at. % to 50 at. %. In the production method, a metallographic structure including a (CoFe)$_2$B phase and a (CoFe)B phase is formed in the sintering step of sintering the mixed powder. In a target material obtained by the production method, a boundary length per unit area Y (1/μm), which is obtained by measuring a boundary length between the (CoFe)$_2$B phase and the (CoFe)B phase by scanning electron microscopic observation, and a proportion X (at. %) of a B content to a total of a Co content, an Fe content, and a B content in the alloy M satisfy the following expression:

$$Y < −0.0015 \times (X−42.5)^2 + 0.15.$$

The first powder and the second powder can be produced by an atomizing method, respectively. The type of the atomizing method is not particularly limited and may be a gas atomizing method, a water atomizing method, or a centrifugal force atomizing method. In carrying out the atomizing method, known atomizing devices and manufacturing conditions are appropriately selected and used.

For mixing the first powder and the second powder, a known mixer can be used. In addition to the first powder and the second powder, a powder(s) having another composition(s) may be mixed to obtain a mixed powder unless the effects of the present invention are impaired.

It is preferable that the mixed powder is sieved and classified before solidification molding. Each powder may be sieved and classified before mixing the first powder and the second powder. The purpose of the sieve classification is to remove particles (coarse powder) having particle sizes of 500 μm or more that hinder sintering. According to this mixed powder, the effects of the present invention can be attained even when the particle size adjustment involves the removal of coarse particles alone.

In producing the target material, the method and conditions for solidifying and molding the mixed powder as the raw material powder are not particularly limited. For example, a hot isostatic pressing method (HIP method), a hot press method, a spark plasma sintering method (SPS method), a hot extrusion method, or the like is appropriately selected. In addition, the method for processing the sintered body obtained by solidification molding is also not particularly limited, and known mechanical processing means can be used.

The target material obtained by the production method according to the present invention is suitably used for, for example, sputtering for forming a thin film of a Co—Fe—B alloy used for MTJ elements. According to this target material, at a high boron content proportion which has been difficult in the past, particle generation during sputtering is remarkably reduced, and thus, the yield of magnetic film production is improved. This makes it possible to efficiently obtain a high-performance and high-quality magnetic film suitable for magnetic devices such as magnetic heads and MRAMs.

Examples

Hereinafter, the effects of the present invention will be clarified by Examples, but the present invention should not be construed in a limited manner based on the description of these Examples.

[Production of First Powder and Second Powder]

Each raw material was weighed, put into a crucible made of a refractory material, and melted by induction heating under reduced pressure in an Ar gas atmosphere, thereby forming compositions shown as first powder and second powder in Tables 1 and 2. Then, the melted molten metal was discharged from a small hole (diameter: 8 mm) provided in the lower part of the crucible and gas-atomized using high-pressure Ar gas, thereby obtaining a raw material powder for producing a target material.

[Production of Sputtering Target Material]

Using the obtained first powders and second powders, target material Nos. 1 to 11 of Examples and target material Nos. 12 and 13 of Comparative Examples were produced.

First, the first powder and the second powder obtained by the gas atomizing method were sieved and classified to remove coarse particles having diameters of 500 μm or more. Next, the first powder and the second powder after sieving and classification were put into a V-type mixer such that the ratio of the mass a of the first powder to the mass b of the second powder was brought to the mixing ratio a:b (% by mass) as shown in Tables 1 and 2, and the powders were mixed for 30 to 60 minutes, thereby obtaining a mixed powder. The obtained mixed powder was filled in a can made of carbon steel (outer diameter: 220 mm; inner diameter: 210 mm; length: 200 mm) and vacuum degassed. Thereafter, a sintered body was produced using an HIP system under conditions of a temperature of 900° C. to 1200° C., a pressure of 100 to 150 MPa, and a holding time of 1 to 5 hours. The obtained sintered body was processed into a disk shape having a diameter of 180 mm and a thickness of 7 mm by wire cutting, lathe processing, and surface polishing, thereby obtaining a sputtering target material.

Target material Nos. 12 and 13 of Comparative Examples were produced by the same procedures except that mixing with a V-type mixer was not carried out.

The compositions of the obtained sputtering target materials are shown in Tables 1 and 2 below. For each target material, the value V was calculated by substituting the proportion of B content (at. %) to the total of Co content, Fe content, and B content into X in the following equation. The values V obtained for the respective target materials are shown in Tables 1 and 2 below.

$$V = -0.0015 \times (X - 42.5)^2 + 0.15.$$

[Scanning Electron Microscopic Observation]

Test pieces were collected from the target materials of Examples and Comparative Examples, and the cross-section of each test piece was polished. The cross-section of each test piece was observed with a scanning electron microscope (SEM), and a reflected electron image in a field of view of 250 μm in length and 400 μm in width was photographed in 5 fields each. Subsequently, image analysis of each field of view was performed to obtain the length of the boundary between the $(CoFe)_2B$ phase and the $(CoFe)B$ phase, and the length of the boundary was divided by the area of each field of view (250 μm×400 nm), thereby calculating the boundary length per unit area of each field of view. The average value of the numerical values calculated in the five fields of view is shown in Tables 1 and 2 below as the boundary length Y (1/μm).

[Particle Evaluation]

Sputtering was performed by DC magnetron sputtering using the target materials of Examples and Comparative Examples. Sputtering conditions are described below.

Substrate: Aluminum substrate (diameter: 95 mm; thickness: 1.75 mm)

Atmosphere in chamber: Argon gas

Chamber internal pressure: 0.9 Pa

Particles having diameters of 0.1 μm or more adhering to an aluminum substrate having a diameter of 95 mm were counted by an optical surface analyzer and rated based on the following criteria. The results are shown in Tables 1 and 2 below as particle evaluation.

A: Number of particles is 10 or less

B: Number of particles is more than 10 and 200 or less

C: Number of particles is more than 200

TABLE 1

| | Examples | | | | | | | | |
|---|---|---|---|---|---|---|---|---|---|
| | Composition (at. %) | | | | | | | | |
| | Target | | | First powder (a) | | | Second powder (b) | | |
| No. | Co | Fe | B | Co | Fe | B | Co | Fe | B |
| 1 | 10 | 55 | 35 | 15 | 35 | 50 | 5 | 75 | 20 |
| 2 | 15 | 45 | 40 | 12.5 | 37.5 | 50 | 20 | 60 | 20 |
| 3 | 60 | 0 | 40 | 50 | 0 | 50 | 70 | 0 | 30 |
| 4 | 20 | 35 | 45 | 18 | 32 | 50 | 30 | 50 | 20 |
| 5 | 40 | 20 | 40 | 37 | 15 | 48 | 46 | 30 | 24 |
| 6 | 33.5 | 26.5 | 40 | 50 | 0 | 50 | 0 | 80 | 20 |
| 7 | 15 | 45 | 40 | 12.5 | 37.5 | 50 | 17.5 | 52.5 | 30 |
| 8 | 0 | 62 | 38 | 0 | 50 | 50 | 0 | 75 | 25 |
| 9 | 29 | 29 | 42 | 25 | 25 | 50 | 32.5 | 32.5 | 35 |
| 10 | 12 | 53 | 35 | 7 | 33 | 60 | 15 | 65 | 20 |
| 11 | 12 | 40 | 48 | 11 | 39 | 50 | 24 | 52 | 24 |

| No. | Mixing ratio a:b (% by mass) | Boundary length Y (1/μm) | Value V | Particle evaluation |
|---|---|---|---|---|
| 1 | 42:58 | 0.02 | 0.07 | A |
| 2 | 59:41 | 0.06 | 0.14 | A |
| 3 | 44:56 | 0.06 | 0.14 | A |
| 4 | 78:22 | 0.06 | 0.14 | B |
| 5 | 60:40 | 0.04 | 0.14 | A |
| 6 | 60:40 | 0.05 | 0.14 | A |
| 7 | 44:56 | 0.06 | 0.14 | A |
| 8 | 45:55 | 0.04 | 0.12 | A |
| 9 | 42:58 | 0.07 | 0.15 | A |
| 10 | 27:73 | 0.03 | 0.07 | B |
| 11 | 90:10 | 0.04 | 0.11 | B |

TABLE 2

| | Comparative Examples | | | | | | | | |
|---|---|---|---|---|---|---|---|---|---|
| | Composition (at. %) | | | | | | | | |
| | Target | | | First powder (a) | | | Second powder (b) | | |
| No. | Co | Fe | B | Co | Fe | B | Co | Fe | B |
| 12 | 0 | 65 | 35 | 0 | 65 | 35 | — | — | — |
| 13 | 14 | 46 | 40 | 14 | 46 | 40 | | | |

| No. | Mixing ratio a:b (% by mass) | Boundary length Y (1/μm) | Value V | Particle evaluation |
|---|---|---|---|---|
| 12 | 100:0 | 0.11 | 0.07 | C |
| 13 | 100:0 | 0.26 | 0.14 | C |

As shown in Table 1, the boundary lengths Y obtained in the target material Nos. 1 to 11 of Examples are smaller than the values V. Meanwhile, as shown in Table 2, the boundary lengths per unit area Y obtained in the target material Nos. 12 and 13 of Comparative Examples are greater than the values V.

Figure 2:
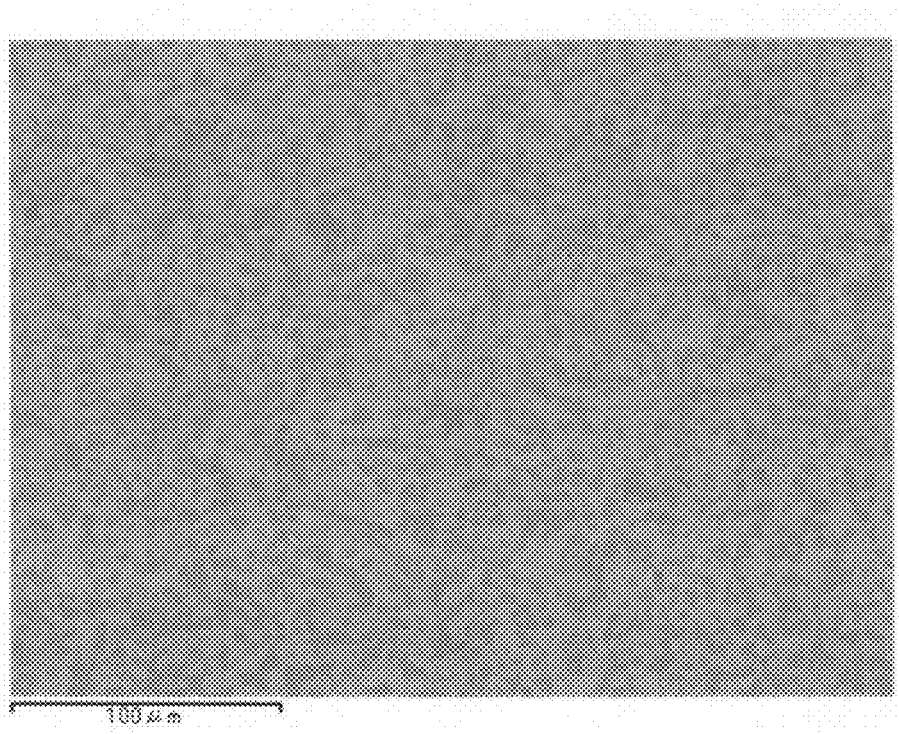
FIG. 2 is a scanning electron microscope image showing the metallographic structure of the alloy forming the sputtering target material of Comparative Examples.

One of the SEM images obtained by photographing the target material No. 4 of Example in five fields of view is shown in FIG. 1. One of the SEM images obtained by photographing the target material No. 13 of Comparative Example in five fields of view is shown in FIG. 2. In FIGS. 1 and 2, the dark gray part is the (CoFe)B phase, and the light gray part is the $(CoFe)_2B$ phase. As shown in the figures, in the metallographic structure of the target material No. 4 of Example, the (CoFe)B phase and the $(CoFe)_2B$ phase are each coarsened. On the other hand, in the target material No. 13 of Comparative Example, a metallographic structure in which the (CoFe)B phase and the $(CoFe)_2B$ phase are refined is formed. From the comparison of FIGS. 1 and 2, it is understood that the target material of Example has a metallographic structure having a smaller boundary area between the (CoFe)B phase and the $(CoFe)_2B$ phase as compared with the target material of Comparative Example.

The generation of particles during sputtering was reduced in Example Nos. 1 to 11 in which the boundary length per unit area Y was smaller than the value V, and the boundary area between the (CoFe)B phase and the $(CoFe)_2B$ phase was small. On the other hand, a large number of particles were generated in Comparative Example Nos. 12 and 13 which had a refined metallographic structure, and in which the boundary length Y was greater than the value V.

As described above, the target materials of Examples have higher evaluations than the target materials of Comparative Examples. From the evaluation results, the superiority of the present invention is obvious.

INDUSTRIAL APPLICABILITY

The sputtering target materials described above can be applied to various applications using a thin film consisting of a Co—Fe—B based alloy.

The invention claimed is:

1. A method of producing a sputtering target material composed of an alloy M comprising B, and Co and/or Fe, with a balance consisting of inevitable impurities, the method comprising a sintering step of sintering a mixed powder obtained by mixing a first powder and a second powder, wherein the first powder and the second powder each consist of particles, wherein each particle forming the first powder is composed of an alloy M1 comprising B, and Co and/or Fe, with a balance consisting of inevitable impurities, wherein a proportion of a B content to a total of a Co content, an Fe content, and a B content in the alloy M1 is from 40 at. % to 60 at. %, wherein each particle forming the second powder is composed of an alloy M2 comprising B, and Co and/or Fe, with a balance consisting of inevitable impurities, wherein a proportion of a B content to a total of a Co content, an Fe content, and a B content in the alloy M2 is from 20 at. % to 35 at. %, wherein a proportion of a B content to a total of a Co content, an Fe content, and a B content in the mixed powder is from 33 at. % to 50 at. %, wherein a metallographic structure comprising a $(CoFe)_2B$ phase in which an atomic ratio of a sum of a Co content and an Fe content (Co content+Fe content) to a B content [(Co content+Fe content):B content] is 2:1, and a (CoFe) B phase in which the atomic ratio [(Co content+Fe content):B content] is 1:1 is formed in the sintering step, and wherein a boundary length per unit area Y (1/μm), which is obtained by measuring a boundary length between the $(CoFe)_2B$ phase and the (CoFe) B phase using a scanning electron microscope, and a proportion X (at. %) of a B content to a total of a Co content, an Fe content, and a B content in the alloy M satisfy the following expression:

$$Y < -0.0015 \times (X-42.5)^2 + 0.15.$$

\* \* \* \* \*